United States Patent
Humburg

(10) Patent No.: US 10,480,497 B2
(45) Date of Patent: Nov. 19, 2019

(54) FEED PUMP, ESPECIALLY FUEL FEED PUMP FOR A VEHICLE HEATER

(71) Applicant: Eberspächer Climate Control Systems GmbH & Co. KG, Esslingen (DE)

(72) Inventor: Michael Humburg, Göppingen (DE)

(73) Assignee: Eberspächer Climate Control Systems GmbH & Co. KG, Esslingen (DE)

( * ) Notice: Subject to any disclaimer, the term of this patent is extended or adjusted under 35 U.S.C. 154(b) by 271 days.

(21) Appl. No.: 15/282,236

(22) Filed: Sep. 30, 2016

(65) Prior Publication Data
US 2017/0096989 A1   Apr. 6, 2017

(30) Foreign Application Priority Data
Oct. 2, 2015 (DE) .......................... 10 2015 116 783

(51) Int. Cl.
*F04B 17/04* (2006.01)
(52) U.S. Cl.
CPC ................... *F04B 17/042* (2013.01)
(58) Field of Classification Search
CPC ........ H01L 41/20; H01L 41/12; F04B 17/042; F04B 17/04; F04B 13/00
See application file for complete search history.

(56) References Cited

U.S. PATENT DOCUMENTS

| | | | |
|---|---|---|---|
| 5,868,375 A * | 2/1999 | Reinicke | F16K 31/0624 251/129.06 |
| 5,992,296 A * | 11/1999 | Murata | F04B 43/0036 92/89 |
| 6,394,770 B1 | 5/2002 | Siegel et al. | |
| 6,515,382 B1 * | 2/2003 | Ullakko | F16D 65/14 310/26 |
| 6,886,331 B2 | 5/2005 | Joshi | |
| 7,322,804 B2 * | 1/2008 | Humburg | F04B 13/00 417/416 |
| 7,621,726 B2 * | 11/2009 | Bachner | F04B 7/04 417/417 |
| 8,696,330 B2 * | 4/2014 | Ohligschlaeger | F04B 17/04 137/533.11 |

(Continued)

FOREIGN PATENT DOCUMENTS

| | | |
|---|---|---|
| CN | 101189431 A | 5/2008 |
| CN | 101839268 A | 9/2010 |

(Continued)

OTHER PUBLICATIONS

Raw machine Translation of JP 2001280215 (A); Title: "Fuel Injection Valve with Magnetic Shape Memory"; Kono et al.; Oct. 10, 2001.*

(Continued)

*Primary Examiner* — Charles G Freay
*Assistant Examiner* — Lilya Pekarskaya
(74) *Attorney, Agent, or Firm* — McGlew and Tuttle, P.C.

(57) ABSTRACT

A feed pump (10), especially fuel feed pump for a vehicle heater, includes a pump piston (36) movable to and fro in a pump chamber (72). The pump piston ejects and receives fluid. A driving arrangement (30) drives the pump piston (36). The driving arrangement (30) includes at least one driving element (28) made of magnetic shape memory material.

20 Claims, 2 Drawing Sheets

(56) References Cited

U.S. PATENT DOCUMENTS

| | | | |
|---|---|---|---|
| 2002/0108446 A1* | 8/2002 | Matsuki | G01B 7/003 73/661 |
| 2003/0108439 A1 | 6/2003 | Joshi | |
| 2004/0145435 A1 | 7/2004 | Ohta et al. | |
| 2006/0144472 A1* | 7/2006 | Ullakko | B06B 1/045 148/104 |
| 2007/0236314 A1 | 10/2007 | Taya et al. | |
| 2009/0105648 A1* | 4/2009 | Rush | A61M 5/14216 604/151 |
| 2014/0091646 A1 | 4/2014 | Schiepp et al. | |
| 2016/0086756 A1* | 3/2016 | Bang | H01F 7/1615 361/160 |

FOREIGN PATENT DOCUMENTS

| | | |
|---|---|---|
| CN | 203670126 U | 6/2014 |
| CN | 104564624 A | 4/2015 |
| DE | 197 56 821 A1 | 8/1998 |
| DE | 199 14 065 A1 | 9/2000 |
| DE | 696 31 346 T2 | 1/2005 |
| DE | 10 2004 034 231 B4 | 7/2006 |
| DE | 10 2005 041 210 A1 | 3/2007 |
| DE | 10 2011 004 362 A1 | 8/2012 |
| DE | 10 2010 010 801 B4 | 2/2013 |
| DE | 10 2012 107 014 A1 | 2/2014 |
| DE | 10 2013 221 744 A1 | 4/2015 |
| EP | 0 997 953 B1 | 1/2004 |
| JP | 2001 280 215 A | 10/2001 |
| WO | 99/45631 A2 | 9/1999 |
| WO | 2012/123535 A1 | 9/2012 |

OTHER PUBLICATIONS

Tickle R et al., Ferromagnetic Shape Memory in the NiMnGa System, IEEE Transactions on Magnetics, IEEE Service Center, New York, NY, US, Bd. 35, Nr. 5, Sep. 1, 1999, pp. 4301-4310, XP011087610, ISSN: 0018-9464, DOI: 10.1109/20.799080.

E. Suorsa et al., Applications of Magnetic Shape Memory Actuators, ACTUATOR 2002, 8th International Conference on New Actuators & 2nd International Exhibition on Smart Actuators and Drive Systems, Jun. 10-12, 2002, Bremen, Germany, Conference Proceedings, published by Messe Bremen GMBH, Bremen, Germany, ISBN-3-933339-05-7.

Hartmut Janocha, Unkonventionelle Aktoren: Eine Einführung, 2. Auflage (überarbeitet), waiter de Gruyter, 2013; ISBN: 3-486756-92-3.

* cited by examiner

FEED PUMP, ESPECIALLY FUEL FEED PUMP FOR A VEHICLE HEATER

CROSS REFERENCE TO RELATED APPLICATIONS

This application claims the benefit of priority under 35 U.S.C. § 119 of German Application DE 10 2015 116 783.2 filed Oct. 2, 2015, the entire contents of which are incorporated herein by reference.

FIELD OF THE INVENTION

The present invention pertains to a feed pump, especially fuel feed pump for a vehicle heater, comprising a pump piston movable to and fro in a pump chamber for ejecting and receiving fluid and a driving arrangement for the pump piston.

BACKGROUND OF THE INVENTION

A feed pump for delivering fuel to the combustion chamber of a fuel-operated vehicle heater is known from DE 10 2011 004 362 A1. A pump piston movable to and fro in its longitudinal direction for receiving fuel to be delivered in a pump chamber and for ejecting fuel received in the pump chamber from the pump chamber is rigidly connected to an armature. The armature or the pump piston is surrounded by a coil, which generates a magnetic field when excited. Due to the interaction with the magnetic field, a force is applied to the armature, and this force moves the armature and hence the pump piston in the direction in which fuel is ejected from the pump chamber. When the excitation of the coil is ended and thus the generation of the magnetic field is ended, the pump piston is moved together with the armature by a resetting spring acting as a resetting element in the direction out of the pump chamber. The pump piston moves during its reciprocating motion between two stops, with which respective elastic elements are associated in order to buffer the stop of the pump piston in both end positions of the reciprocating motion.

A pump, by which liquid fuel can be delivered to a combustion chamber of a vehicle heater, is known from DE 10 2013 221 744 A1. This pump comprises a tubular pump body made of a magnetic shape memory material. When a magnetic field is generated, the pump body made of magnetic shape memory material is deformed by interaction with this. The volume enclosed by the tubular pump body is changed by the deformation. This change in volume occurring alternatingly during excitation and upon the end of the excitation can be used to deliver the liquid fuel in the direction of a combustion chamber.

SUMMARY OF THE INVENTION

An object of the present invention is to provide a feed pump, which can be manufactured in a cost-effective manner and with which improved meterability of the medium being delivered is achieved and the development of stop noises during the motion of a pump piston is avoided.

This object is accomplished according to the present invention by a feed pump, especially fuel feed pump for a vehicle heater, comprising a pump piston movable to and fro in a pump chamber for ejecting and receiving fluid and a driving arrangement for the pump piston.

Further, provisions are made for the driving arrangement to comprise at least one driving element made of a magnetic shape memory material.

The present invention utilizes, on the one hand, the effect that a body made of a magnetic shape memory material, namely, a driving element, changes its shape due to the interaction with a magnetic field. This change in shape can be used in the configuration according to the present invention to generate a force moving a pump piston. Since, unlike in the configuration known from DE 10 2013 221 744 A1, the pumping action is achieved by the reciprocating motion of a pump piston in a pump chamber and the driving element made of magnetic shape memory material is used only to generate a driving force for the pump piston, it is not necessary to ensure a complex shape, for example, configuration as a hollow body, of the at least one driving element. The driving element may be provided with a comparatively simple shape, which simplifies the manufacturing process for manufacturing the driving element, on the one hand, and, on the other hand, leads to markedly reduced manufacturing costs. Since the change in the shape of the driving element made of a magnetic shape memory material can be set very precisely due to the interaction with a magnetic field, namely, by presetting the magnetic field intensity, the dimension of the pump piston moved by the at least one driving element can be set correspondingly precisely as well. It is thus possible to affect the volume of the medium being delivered not only by the frequency of the reciprocating motion, but also by the extent, i.e., the amplitude of the reciprocating motion. In particular, the development of stop noises at the respective motion dead centers can thus be avoided, because, on the one hand, the motion of the pump piston can be slowed down when a particular motion dead center is being approached due to a corresponding variation of the magnetic field acting on the at least one driving element. On the other hand, a direct stop contact of the pump piston with components limiting its motion can be avoided practically completely during a respective reversal of motion.

The magnetic shape memory material may comprise a magnetic shape memory alloy. The use of an NiMnGa alloy has proved to be especially advantageous in respect to the change in shape and volume that can be achieved.

To make it possible to achieve a change in the shape of the at least one driving element and hence a motion of the pump piston, the driving arrangement may comprise a magnetic field generation unit, preferably with an electrically excitable coil arrangement for generating a magnetic field acting on the at least one driving element.

The at least one driving element can act on the pump piston in a first action direction when magnetic field is generated, and in case of action in the first action direction, the at least one driving element acts on the pump piston in the direction in which fluid is ejected from the pump chamber.

A change in shape and hence a driving force acting in a direction can be generated by the interaction of a driving element with a magnetic field. To move the pump piston back again, the driving arrangement may comprise a first resetting means for acting on the pump piston in a second action direction directed essentially opposite the first action direction. The first resetting means preferably acts on the pump piston from the direction in which fluid is received in the pump chamber in case of action in the second action direction.

Since the at least one driving element made of magnetic shape memory material can be deformed in one direction only due to the interaction with a magnetic field, it is, further, proposed according to the present invention that a second resetting means be associated with the at least one driving element for resetting the at least one driving element into an initial state to be assumed when no magnetic field is generated, i.e., in a state free from magnetic field. If provisions are made now for the first resetting means to provide the second resetting means, resetting of both the pump piston and of the driving element can be brought about by one and the same component or by one and the same assembly unit. For example, this resetting action can be achieved by the first resetting means or/and the second resetting means comprising a resetting spring.

To make it possible to send the medium or fluid to be delivered, i.e., for example, fuel in the direction of the pump chamber, it is proposed that the at least one driving element be arranged in a driving element housing providing a fluid inlet duct.

The pump piston may be movable to and fro in a pump piston housing in the direction of a longitudinal axis of the pump. To facilitate the entry of fluid being fed via the fluid inlet duct into the pump chamber, it is proposed that the driving element housing and the pump piston housing provide a passage opening for a transmission member or/and for the passage of fluid, which couples the at least one driving element with the pump piston for transmitting the driving force.

To make it possible to provide a housing for the pump piston, on the one hand, and a housing providing the pump chamber, on the other hand, in a simple manner, a pump chamber housing providing the pump chamber may be provided at the pump piston housing. The pump piston housing may also be used to support a resetting means acting on the pump piston.

To introduce fluid to be delivered into the pump chamber, a fluid passage duct passing through the pump piston may be provided in the pump piston according to an especially advantageous aspect.

A defined direction of flow for the fluid to be delivered by the reciprocating motion of the pump piston can be achieved by a nonreturn inlet valve being provided in the pump piston or/and by a nonreturn outlet valve being provided in a pump chamber housing.

The present invention will be described in detail below with reference to the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
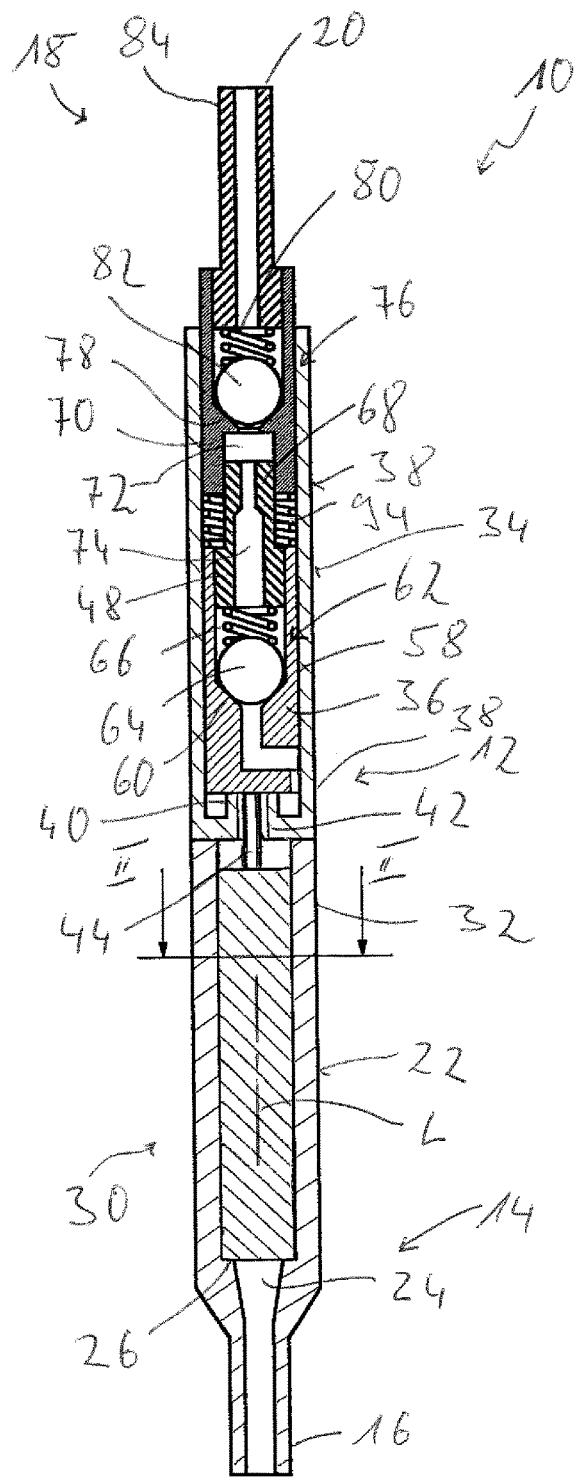
FIG. 1 is a longitudinal sectional view of a feed pump with a pump piston positioned in a first end position.
Figure 2:
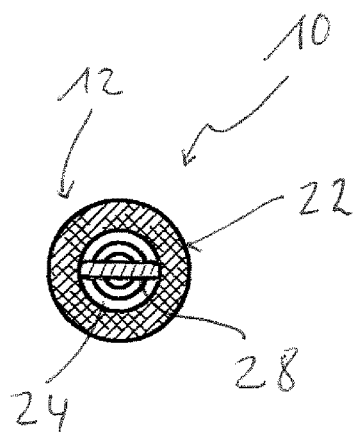
FIG. 2 is a cross-sectional view of the feed pump shown in FIG. 1, taken along a line II-II in FIG. 1.

Referring to the drawings, FIGS. 1 and 2 show a feed pump generally designated by 10, which can be used, for example, to deliver liquid fuel from a fuel tank in the direction of a combustion chamber of a fuel-operated motor vehicle heater. The feed pump 10 comprises a pump housing generally designated by 12 and composed of a plurality of parts. An inlet pipe 16, to which, for example, a flexible tube leading to a fuel tank can be connected, is provided at an inlet end area 14 of the pump housing 12. An outlet pipe 20, to which a flexible tube, leading, for example, to a combustion chamber, can be connected, is provided at an outlet end area 18.

The pump housing 12 comprises a driving element housing 22, which is elongated in the direction of the longitudinal axis L of the pump and which provides the inlet end area 14 and also the inlet pipe 16. A fluid inlet duct 24, extending fully in the direction of the longitudinal axis L of the pump, is provided in the driving element housing 22. In the area of the inlet end area 14, this fluid inlet duct has a step-like expansion 26, at which a driving element 28 made of a magnetic shape memory material, e.g., an NiMnGa alloy, which is elongated in the direction of the longitudinal axis L of the pump, is supported. The driving element 28 forms an essential component of a driving arrangement generally designated by 30. As can be seen in FIG. 2, the driving element 28 has an essentially plate-like configuration, so that a flow volume of the fluid inlet duct 24 is provided on both sides of said driving element 28 and the fluid to be delivered, i.e., for example, fuel, can flow through the driving element housing 22, flowing around the driving element 28.

At an end area 32 of the driving element housing 22, located at a distance from the inlet end area 14, the driving element housing 22 is connected rigidly and in a fluid-tight manner to a pump piston housing 34, likewise elongated in the direction of the longitudinal axis L of the pump. A pump piston generally designated by 36 is received in the pump piston housing 34 such that the pump piston 36 is movable in the direction of the longitudinal axis L of the pump. A contact attachment 40 for the pump piston 36 is provided at the end area 38 of the pump piston housing 34, which end area is located close to the end area 32 of the driving element housing 22 and is connected thereto. A passage opening 42 is provided in the contact attachment 40 or in the end area 38 of the pump piston housing 34. The passage opening 42 makes, together with the axially open end area 32 of the driving element housing 22, a fluid flow path from the fluid inlet duct 24 into the pump piston housing 34, on the one hand, and makes possible, on the other hand, the passage of a transmission member 44 coupling the driving element 28 with the pump piston 36 for transmitting the driving force.

The pump piston 36 is configured with two piston parts 46, 48, which are inserted one into the other and are rigidly connected to one another. In piston part area facing the contact attachment 40, the piston part 46 has a plate-like end section 50, which closes the passage opening 42 against the passage of fluid when the pump piston 36 is in contact with the contact attachment 40. A valve seat 60, which is, for example, conical, is provided for a nonreturn inlet valve generally designated by 62 in a central body area 58 of the piston part 46, which said body area 58 is connected to the plate-like end area 50, for example, via three webs 52, 54, 56. This nonreturn inlet valve comprises a valve element 64, designed, for example, as a ball, which is prestressed by a valve spring 66 onto the valve seat 60. The valve spring 66 is supported at the piston part 48, which is inserted into the piston part 46 and is rigidly connected to same.

With an end area 68 facing away from the piston part 46, the piston part 48 of the pump piston 36 meshes with a pump chamber 72 formed in a pump chamber housing 70. The volume of the pump chamber 72 that can be filled with fluid is reduced during the motion of the pump piston 36 in FIG. 1 in the upward direction, i.e., in the direction of the outlet end area 18 of the pump housing 12. Due to the increasing fluid pressure in the pump chamber 72 and in a fluid passage duct 74 passing through the pump piston 36 essentially in the direction of the longitudinal direction L of the pump, the nonreturn inlet valve 62 is stressed even more in the direction of its closed position, so that the fluid contained in the pump chamber 72 can escape from the pump chamber 72 via a nonreturn outlet valve 76 only and can flow off via the outlet pipe 20. The nonreturn outlet valve 76 comprises a valve seat 78 formed in the pump chamber housing 70 and a valve element 82, which is configured, for example, as a ball and is pressed by a valve spring 80 against this valve seat 78. The valve spring 80 is supported now at a pipe part 84, which provides the outlet pipe 20 of the pump housing 12 and is inserted into the pump chamber housing 78 in a fluid-tight manner.

If the pump piston 36 is moving downward in the view shown in FIG. 1, the volume of the pump chamber 72 that can be filled with fluid increases. Supported by the fluid pressure prevailing in the fluid inlet duct 24, the valve element 64 of the nonreturn inlet valve 62 can lift off from its valve seat 60 during the motion of the pump piston 36, so that fluid can enter the fluid passage duct 74 of the pump piston 36 and hence also the area of the pump chamber 72 from the fluid inlet duct 24 and from the inner volume area of the pump piston housing 34. Backflow of fluid already ejected from the pump chamber 72 via the outlet pipe 20 is prevented by the nonreturn outlet valve 76.

Figure 3:
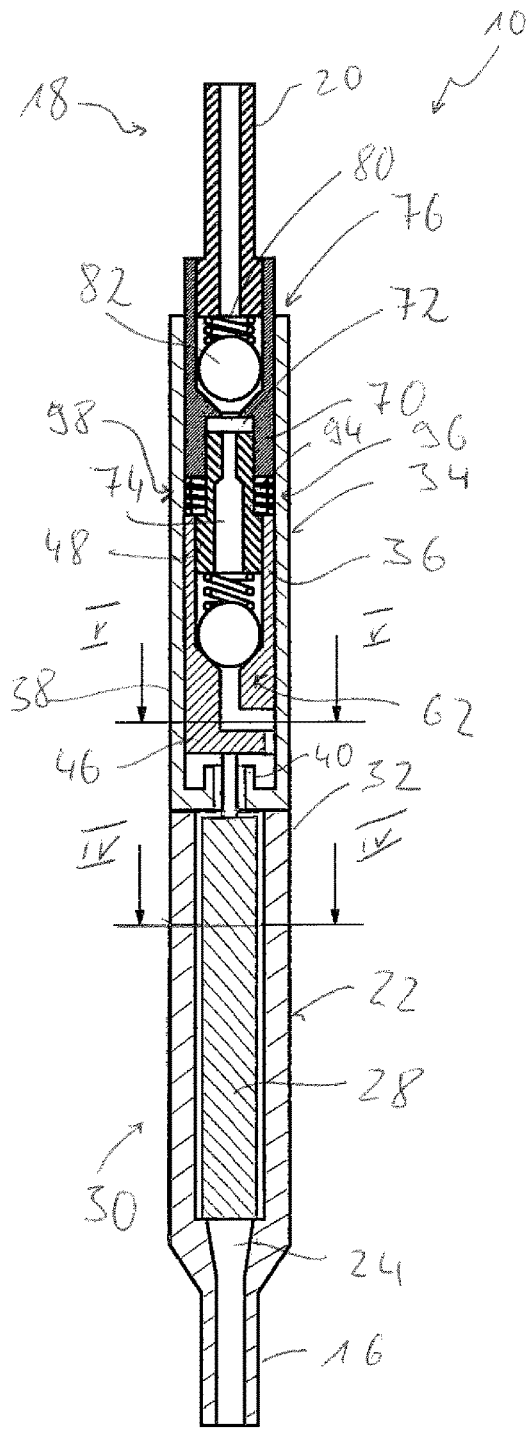
FIG. 3 is a view corresponding to FIG. 1 with the pump piston positioned in a second end position.
Figure 4:
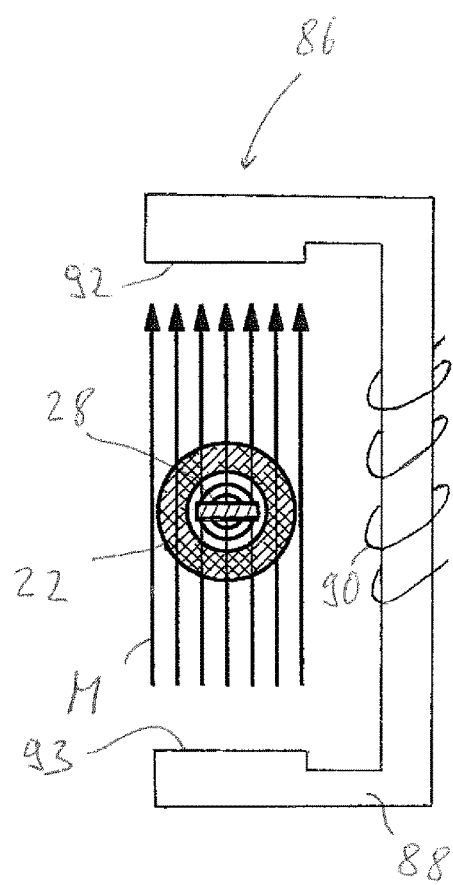
FIG. 4 is a cross-sectional view with the feed pump according to FIG. 3, taken along a line IV-IV in FIG. 3.
Figure 5:
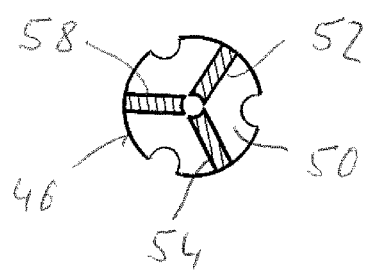
FIG. 5 is a cross-sectional view of the pump piston of the feed pump according to FIG. 3, cut along a line V-V in FIG. 3.

The driving arrangement 30 already mentioned with its driving element 28 made of magnetic shape memory material is provided to bring about this reciprocating motion of the pump piston 36 for receiving fluid in the pump chamber 72 and for ejecting fluid from the pump chamber 72. The driving arrangement 30 comprises, further, a magnetic field generation arrangement 86 shown schematically in FIG. 4. This may comprise, for example, a coil arrangement 90 guided around a yoke 88 made of a metallic material. When the coil arrangement 90 is excited, a magnetic field M is generated between the two poles 92, 93 of the yoke 88, which are located opposite each other. This magnetic field M extends essentially at right angles to the longitudinal axis L of the pump and also at right angles to the driving element 28 having a plate-like configuration. The driving element 28 made of magnetic shape memory material changes its shape due to the interaction with the magnetic field M, so that this changes its shape, especially its length, as this is shown by the transition from FIG. 1 showing the state without magnetic field to FIG. 3 showing the state with magnetic field. The width of the driving element 28 decreases with increasing length. A change in the length of the driving element 28 by up to about 10% can be achieved in this manner.

This change in the length of the driving element 28, occurring when the magnetic field M is generated by the magnetic field generation arrangement 86, is used to bring about a corresponding displacement of the pump piston 36. In particular, a driving force is transmitted by the transmission member 44, which is, for example, pin-shaped or bolt-shaped, to the piston part 46 of the pump piston 36. The pump piston 36 is displaced in the process against the resetting action of a resetting spring 94 at the piston part 46, on the one hand, and at the pump chamber housing 70, on the other hand, which said resetting spring also surrounds the piston part 48. This resetting spring 94, configured, for example, as a compression coil spring, thus forms a first resetting means 96, by which the pump piston 36 is acted on in the direction from the pump chamber 72 and hence from the direction in which fluid to be delivered is received in the pump chamber 72. At the same time, the resetting spring 94 forms a second resetting means 98, by which a resetting force is applied to the driving element 28 via the pump piston 36 and the piston part 46 and the transmission member 44. This is necessary because even though the driving element 28 made of magnetic shape memory material changes its shape and length if it is exposed to the magnetic field M, it cannot return into its previously assumed initial state shown, for example, in FIG. 1 when the generation of the magnetic filed M is ended. The action of an external force is necessary for this, which is generated in the exemplary embodiment being shown by the resetting spring 94 in its function as a second resetting means 98.

A corresponding alternating reciprocating motion of the pump piston can be brought about, on the one hand, under the action of the magnetic field M generated by means of the magnetic field generation arrangement 86 and, on the other hand, under the action of the resetting spring 94, due to the alternating or periodic excitation of the magnetic field generation arrangement 86 or of the coil arrangement 90 and the correspondingly periodic generation of the magnetic filed M, i.e., the alternation between a state with magnetic field and a state without magnetic field or a state with stronger magnetic field and a state with weaker magnetic field. By setting the period of the reciprocating motion, the work cycles performed per unit of time, i.e., for example, per second, and hence also the ejected volume of the fluid being delivered can be set. The volume of the pump chamber 72 can be utilized in this case to the maximum extent if the pump piston 36 is moved to and fro between the maximum end positions the pump piston 36 can assume during this reciprocating motion. This is, on the one hand, an end position in which the piston part 46 is in contact with the contact attachment 40, and it is, on the other hand, an end position in which the resetting spring 94 is compressed to the maximum extent or the piston part 48 optionally strikes a bottom area of the pump chamber 72.

However, the extent of the change in the shape and length of the driving element 28 can also be set in a simple manner by correspondingly setting the field intensity of the magnetic field M when using the driving arrangement 30 provided according to the present invention, so that the pump piston 36 is not necessarily moved to and fro between these two maximum end positions, but only a shorter motion is performed during each stroke and only a smaller volume of fluid is correspondingly also ejected from the pump chamber 72. Thus, the quantity of fluid being delivered is not affected by the setting of the frequency of the reciprocating motion or it is affected not only by the setting of the frequency of this reciprocating motion, but the volume being delivered can also be affected especially by the extent of the stroke, i.e., the amplitude of the reciprocating motion. This makes it possible to eject even very small volumes of the fluid being delivered with high precision as a nearly continuous stream. For example, it is possible to operate with a comparatively high frequency. The use of a driving element 28 made of a magnetic shape memory material allows an operating frequency in the kHz range. If the amplitude is set now at a correspondingly low value, a very small volume of the fluid being delivered can also be ejected during each operating cycle. The defined generation of the magnetic field M also makes it possible, in particular, to gradually slow down the pump piston 36 when it is approaching a particular end position, so that a striking of the pump piston 36 leading to perceptible vibration or noise can be avoided.

While specific embodiments of the invention have been shown and described in detail to illustrate the application of the principles of the invention, it will be understood that the invention may be embodied otherwise without departing from such principles.

What is claimed is:

1. A feed pump for feeding fuel for a vehicle heater, the feed pump comprising:
   a pump chamber;
   a pump piston housing;
   a pump piston received in the pump piston housing such as to be movable to and fro in the pump chamber, and in a direction of a longitudinal axis of the feed pump, for ejecting fluid from the pump chamber and for receiving fluid within the pump chamber;
   a driving element housing connected to the pump piston housing and providing a fluid inlet duct;
   a driving arrangement driving the pump piston, the driving arrangement comprising at least one driving element made of a magnetic shape memory material, the at least one driving element being arranged in the driving element housing; and
   a transmission element coupling the at least one driving element with the pump piston for transmitting a driving force, the driving element housing and the pump piston housing providing a passage opening for passage of the transmission element, wherein the passage opening provides passage of fluid from the driving element housing to an inner volume area of the pump piston housing, the pump piston having a fluid passage duct passing through the pump piston and providing fluid communication between the inner volume area of the pump piston housing and the pump chamber.

2. A feed pump in accordance with claim 1, wherein the magnetic shape memory material comprises a magnetic shape memory alloy comprised of NiMnGa alloy.

3. A feed pump in accordance with claim 1, wherein the driving arrangement further comprises a magnetic field generation unit with an electrically excitable coil arrangement generating a magnetic field acting on the at least one driving element.

4. A feed pump in accordance with claim 3, wherein the at least one driving element acts on the pump piston in a first action direction when the magnetic field is generated, and the at least one driving element acts on the pump piston in a direction in which fluid is ejected from the pump chamber upon action in the first action direction.

5. A feed pump in accordance with claim 4, wherein the driving arrangement further comprises a resetting means for acting on the pump piston in a second action direction, directed essentially opposite the first action direction.

6. A feed pump in accordance with claim 5, wherein the resetting means is a first resetting means and the driving arrangement further comprises a second resetting means associated with the at least one driving element for resetting the at least one driving element into an initial state to be assumed when no magnetic field is generated.

7. A feed pump in accordance with claim 6, wherein the first resetting means and the second resetting means are comprised by a common resetting means for both acting on the pump piston, in the second action direction, and for resetting the at least one driving element into an initial state.

8. A feed pump in accordance with claim 6, wherein the first resetting means or the second resetting means comprises a resetting spring or both the first resetting means and the second resetting means comprises a resetting spring.

9. A feed pump in accordance with claim 5, wherein the resetting means comprises a resetting spring.

10. A feed pump in accordance with claim 1, wherein a pump chamber housing, providing the pump chamber, is provided in the pump piston housing.

11. A feed pump in accordance with claim 10, further comprising a resetting means acting on the pump piston and supported at the pump chamber housing, the resetting means for acting on the pump piston in a second action direction, directed essentially opposite the first action direction.

12. A feed pump in accordance with claim 1, wherein a nonreturn inlet valve is provided in the pump piston.

13. A feed pump in accordance with claim 1, wherein a nonreturn outlet valve is provided in a pump chamber housing.

14. A feed pump in accordance with claim 1, wherein the magnetic shape memory material is comprised of a magnetic shape memory alloy.

15. A feed pump in accordance with claim 12, wherein the pump piston comprises:
    two piston parts inserted into another and rigidly connected to one another;
    a valve element, wherein one of the piston parts provides a valve seat for the valve element of the non-return inlet valve and has a plate-shaped end section for closing the passage opening for the transmission element when the piston is in contact with a contact attachment defining the passage opening for the transmission element.

16. A feed pump comprising:
    a pump piston housing, wherein a pump chamber is defined within the pump piston housing;
    a pump piston cooperating with the pump piston housing and movable in a direction of a longitudinal axis of the feed pump, for ejecting fluid from the pump chamber and receiving fluid within the pump chamber, the pump piston defining a fluid passage duct passing through the pump piston;
    a driving element housing connected to the pump piston housing and providing a fluid inlet duct and an outlet passage opening between the driving element housing and an inner volume area of the pump piston housing, the fluid passage duct of the pump piston defining a fluid communication path between the inner volume area of the pump piston housing and the pump chamber;
    a driving element made of a magnetic shape memory material, the driving element being arranged in the driving element housing and affecting fluid passage from the fluid inlet duct to the outlet passage opening; and
    a transmission element coupling the driving element with the pump piston for transmitting a driving force from the driving element to the pump piston; and a magnetic field generation unit with an electrically excitable coil arrangement generating a magnetic field acting on the driving element to change a shape of the driving element made of a magnetic shape memory material from an initial shape position, to generate the driving force transmitted from the driving element to the pump piston via the transmission element.

17. A feed pump in accordance with claim 16, further comprising a resetting means, wherein: the driving element acts on the pump piston in a first action direction when the magnetic field is generated, and the driving element acts on the pump piston in a direction in which fluid is ejected from the pump chamber upon action in the first action direction; and 6 the resetting means acts on the pump piston in a second action direction, directed essentially opposite the first action direction.

18. A feed pump in accordance with claim 17, wherein the resetting means is a first resetting means and the driving arrangement further comprises a second resetting means, associated with the driving element, for resetting the driving element into the initial shape position.

19. A feed pump in accordance with claim 18, wherein the first resetting means and the second resetting means are comprised by a common resetting means for both acting on the pump piston in the second action direction and for resetting the driving element into the initial shape position.

20. A feed pump in accordance with claim 18, wherein the pump piston comprises:
   two piston parts inserted one into another and rigidly connected to one another; and
   a valve element, wherein a nonreturn inlet valve is provided in the pump piston and one of the piston parts provides a valve seat for the valve element of the non-return inlet valve and has a plate-shaped end section for closing the passage opening for the transmission element, when the piston is in contact with a contact attachment defining the outlet passage opening, and the outlet passage opening also provides passage of the transmission element.

\* \* \* \* \*